United States Patent [19]

Oka

[11] Patent Number: 4,963,460
[45] Date of Patent: Oct. 16, 1990

[54] LIGHT-SENSITIVE MATERIAL CONTAINING SILVER HALIDE, REDUCING AGENT AND POLYMERIZABLE COMPOUND WITH SILVER HALIDE OUTSIDE AND INSIDE OF MICROCAPSULES

[75] Inventor: Yutaka Oka, Kanagawa, Japan

[73] Assignee: Fuji Photo Film Co., Ltd., Kanagawa, Japan

[21] Appl. No.: 401,604

[22] Filed: Aug. 31, 1989

[30] Foreign Application Priority Data

Aug. 31, 1988 [JP] Japan .................................. 63-218966

[51] Int. Cl.$^5$ ........................... G03C 5/54; G03C 1/02
[52] U.S. Cl. ..................................... 430/138; 430/203
[58] Field of Search .......................................... 430/138

[56] References Cited

U.S. PATENT DOCUMENTS

| | | | |
|---|---|---|---|
| 4,767,690 | 8/1988 | Yamamoto | 430/138 |
| 4,820,610 | 4/1989 | Nakamura et al. | 430/138 |
| 4,842,977 | 6/1989 | Kakimi | 430/138 |
| 4,912,011 | 3/1990 | Yamamoto et al. | 430/138 |

*Primary Examiner*—Richard L. Schilling
*Attorney, Agent, or Firm*—Sughrue, Mion, Zinn, Macpeak & Seas

[57] ABSTRACT

A light-sensitive material comprises a support and a light-sensitive layer which contains silver halide, a reducing agent and an ethylenic unsaturated polymerizable compound. The silver halide and the polymerizable compound are contained in microcapsules which are dispersed in the light-sensitive layer. According to the present invention, the light-sensitive layer further contains silver halide which is arranged outside of the microcapsules. It is preferred that the sensitivity of the silver halide arranged outside of the microcapsules is higher than the sensitivity of the silver halide contained in the microcapsules. The difference between the two silver halides in the sensitivity preferably is not less than 0.3 in terms of log E.

13 Claims, No Drawings

LIGHT-SENSITIVE MATERIAL CONTAINING SILVER HALIDE, REDUCING AGENT AND POLYMERIZABLE COMPOUND WITH SILVER HALIDE OUTSIDE AND INSIDE OF MICROCAPSULES

FIELD OF THE INVENTION

The present invention relates to a light sensitive material which comprises a support and a light sensitive layer containing silver halide, a reducing agent and a polymerizable compound.

BACKGROUND OF THE INVENTION

A light-sensitive material comprising a support and a light-sensitive layer containing silver halide, a reducing agent and a polymerizable compound is used in an image forming method. The image forming method comprises image wise exposing to light the light-sensitive material to form a latent image of silver halide, and developing the light-sensitive material to imagewise polymerize the polymerizable compound.

Examples of the image forming method are described in Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publication No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,560,637), No. 58(1983)-121031 (corresponding to U.S. Pat. No. 4,547,450) and No. 58(1983)-169143. In the image forming method disclosed in the aforementioned publications, when the exposed silver halide is developed using a developing solution, the polymerizable compound is induced to polymerize in the presence of a reducing agent to form a polymer image. Thus, this method need a wet development process using a developing solution. Therefore, the process takes a relatively long time.

An improved image forming method employing a dry process is described in Japanese Patent Provisional Publications No. 61(1986)-69062 and No. 61(1986)-73145 (the contents of both publications are described in U.S. Pat. No. 4,629,676 and European Patent Provisional Publication No. 0174634A2). In this image forming method, a recording material (light-sensitive material) comprising a light-sensitive layer containing a light-sensitive silver salt (silver halide), a reducing agent, a polymerizable compound and a binder provided on a support is imagewise exposed to light to form a latent image, and then the material is heated to polymerize within the area where the latent image of the silver halide has been formed.

In the above-mentioned light-sensitive material, the silver halide and the polymerizable compound are preferably contained in microcapsules which are dispersed in the light-sensitive layer. The light-sensitive material employing the microcapsules gives a clear image improved in the sharpness. The light-sensitive material employing the microcapsules is described in U.S. Pat. Nos. 4,629,676, 4,767,690, 4,833,062 and European Patent Provisional Publication No. 0203613A2.

SUMMARY OF THE INVENTION

The present inventor has further studied the light sensitive material employing the microcapsules. By the observation of the image obtained by the light-sensitive material, the present inventor has found that a small amount of the polymerizable compound remains within the area where the latent image of the silver halide has been formed. A polymerization reaction should completely proceed within the area. The remaining unpolymerized polymerizable compound within the area reduces the contrast of the image and causes a stain, even if the remaining amount is small.

An object of the invention is to provide a light-sensitive material which gives an more improved clear image having a high contrast.

There is provided by the present invention a light-sensitive material comprising a support and a light-sensitive sitive layer which contains silver halide, a reducing agent and an ethylenic unsaturated polymerizable compound, said silver halide and polymerizable compound being contained in microcapsules which are dispersed in the light-sensitive layer, wherein the light-sensitive layer further contains silver halide which is arranged outside of the microcapsules.

The sensitivity of the silver halide arranged outside of the microcapsules preferably is higher than the sensitivity of the silver halide contained in the microcapsules, and the difference between the two silver halides in the sensitivity preferably is not less than 0.3 in terms of log E.

According to study of the present inventor, it has been found that a small amount of the polymerizable com. pound oozes out of the microcapsules when the light-sensitive material is preserved or heated for a development process. Therefore, a small amount of the polymerizable compound remains within the area where the latent image of the silver halide has been formed, since the polymerization reaction scarcely proceeds with respect to the polymerizable compound which has oozed out of the microcapsules containing silver halide.

The light-sensitive material of the present invention is characterized in that silver halide is also arranged outside of the microcapsules. By the function of the silver halide arranged outside, the polymerization reaction scarcely proceeds with respect to the polymerizable compound which has oozed out of the microcapsules as well as the polymerizable compound contained in the microcapsules. Accordingly, the unpolymerized polymerizable compound does not remain within the area where the latent image of the silver halide has been formed. Therefore, the light-sensitive material of the present invention gives an more improved clear image having a high contrast.

According to further study of the present inventor, the sensitivity of the silver halide arranged outside of the microcapsules preferably is higher than the sensitivity of the silver halide contained in the microcapsules in order to obtain the above-mentioned effect of the present invention.

DETAILED DESCRIPTION OF THE INVENTION

Examples of the silver halide employable in the light-sensitive sensitive material of the present invention include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multilayer structure in which the halogen composition varies from the outer surface portion (i.e., shell) to the inside portion (i.e., core) are described Japanese Patent Provisional Publication Nos. 57(1982)-154232, 58(1983)-108533, 59(1984)-48755 and 59(1984)-52237, U.S. Pat. No. 4,433,048, and European Patent No. 100,984. A silver halide grain having a core/shell structure in which the silver iodide content in the shell is higher than that in the core can be also employed as described in Japanese Patent Provisional Publication No. 62(1987)-183453.

There is no specific limitation on the crystal habit of silver halide grains. For example, a tabular grain having an aspect ratio of not less than 3 can be used as described in Japanese Patent Provisional Publication No. 62(1987)-210455.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed, as described in Japanese Patent Provisional Publication No. 62(1987)-210448.

The silver halide grains preferably have a mean grain (or particle) size of 0.001 to 5 $\mu$m, more preferably 0.001 to 2 $\mu$m.

In the light-sensitive material of the present invention, silver halide is not only contained in the microcapsules, but also arranged outside of the microcapsules. The silver halide arranged outside of the microcapsules may be the same as the silver halide contained in the microcapsules. But, the silver halide arranged outside of the microcapsules is preferably different from the silver halide contained in the microcapsules.

The sensitivity of the silver halide arranged outside of the microcapsules preferably is higher than the sensitivity of the silver halide contained in the microcapsules. The difference between the two silver halides in the sensitivity preferably is not less than 0.3 in terms of log E, and more preferably is not less than 0.5 in terms of log E.

The character "E" of log E is defined as the product of the irradiance "I" incident upon the photosensitive surface and the time "t" during which is allowed to act; that is E=It. The definition of the "log E" is described in T. James, "The Theory of the Photographic Process", 4th edition, pp. 481 (1977).

The silver halide grains contained in the microcapsules preferably have such a relatively low tendency to be fogged that the amount of developed silver is not more than 5 weight % (more preferably not more than 2 weight %, and most preferably in the range of 0.01 to 1 weight %) based on the total amount of silver when the unexposed silver halide grains are developed in 1 l of an aqueous developing solution containing 1.0 g of methol, 15.0 g of sodium sulfite, 4.0 g of hydroquinone, 26.7 g of sodium carbonate monohydrate and 0.7 g of potassium bromide.

In contrast to the silver halide contained in the microcapsules, the silver halide grains arranged outside of the microcapsules preferably have such a relatively high tendency to be fogged that the amount of developed silver is more than 5 weight % based on the total amount of silver when the unexposed silver halide grains are developed in the above-mentioned developing solution.

The silver halide grains arranged outside of the microcapsules may be fogged silver halide. The silver halide grains can be chemically fogged by used a known fog fogging agent. The silver halide grains may be fogged by irradiating the silver halide grains with light or heating the grains.

In the case that two or more different microcapsules respectively contain two or more silver halide grains which are different from each other in the spectral sensitivity to form a full color image, the silver halide grains arranged outside of the microcapsules preferably are panchromatic.

The amount of the silver halide grains contained in the light-sensitive layer preferably is in the range of 0.1 mg/m$^2$ to 10 g/m$^2$ in terms of silver contained the silver halide and an organic silver salt which is one of optional components. The amount of the silver halide contained in the light-sensitive layer preferably is not more than 1 g/m$^2$, more preferably in the range of 1 to 500 mg/m$^2$, in terms of silver only contained in the silver halide.

The amount of the silver halide arranged outside of the microcapsules preferably is in the range of 5 to 100 mole % of the amount of the silver halide contained in the microcapsules.

The silver halide arranged outside of the microcapsules may be adsorbed on the surface of the microcapsules. By the function of the silver halide adsorbed on the surface of the microcapsules, the polymerization reaction of the polymerizable compound which has oozed out of the microcapsules proceeds on the surface of the microcapsules. Accordingly, the polymerization reaction proceeds exactly within the area where the latent image of the silver halide has been formed, since the silver halide prevents the unpolymerized polymerizable compound from moving into the area where the latent image of the silver halide has not been formed. Therefore, the area where the polymerization reaction proceeds completely corresponds to the area where the latent image of the silver halide has been formed, when the silver halide arranged outside of the microcapsules may be adsorbed on the surface of the microcapsules.

The silver halide adsorbed on the surface of the microcapsules can be confirmed by using a scanning electron microscope.

The silver halide can be adsorbed on the surface of the microcapsules by the following various means.

(1) A cationic polymer is added to the dispersion of microcapsules so that the polymer is adsorbed on the surface of the microcapsules. A silver halide emulsion is then added to the dispersion of the microcapsules. In this case, the ionic materials (such as protective colloids) are preferably removed from the dispersion of the microcapsules, prior to adding the silver halide emulsion to the dispersion. However, there is no need of removing cationic protective colloids. The cationic polymer is effective in the case that solid particles of a base or base precursor are also adsorbed on the surface of the microcapsules.

(2) In preparation of microcapsules, the shell of the microcapsules is formed in the presence of silver halide.

(3) A dispersion of silver halide in a medium such as alcohol is added to the dispersion of the microcapsules. The medium is then removed by evaporation.

The means (1) is most preferred, since the silver halide may be efficiently adsorbed on the surface of the microcapsules.

Examples of the cationic polymer include a homopolymer containing a quarternary ammonium salt and a copolymer of a polymer containing a quarternary ammonium salt and a vinyl polymer such as polystyrene. A cationated polyvinyl alcohol (particularly polyvinyl alcohol cationated by an aminoalkyl acrylate) is most preferred. Acid-treated gelatin and polymethyleneimine are also available.

Molecular weight of the cationic polymer preferably is in the range of 50,000 to 500,000. The cationic polymer is preferably used in an amount of 0.05 to 50 weight % (more preferably 0.5 to 20 weight %) based on the amount of the microcapsules (having an average particle size in the range of 3 to 30 μm and a specific gravity in the range of 0.8 to 1.2).

In addition to the silver halide, the other components of the light-sensitive material of the present invention are described below.

The reducing agent has a function of reducing the silver halide and/or a function of accelerating polymerization of the polymerizable compound. Examples of the reducing agent include hydroquinones, catechols, p-aminophenols, p-phenylenediamines, 3-pyrazolidones, 3-aminopyrazoles, 4-amino-5-pyrazolones, 5-aminouracils, 4,5-dihydroxy, 6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfon. amidopyrazolotriazoles, α-sulfonamidoketones and hydrazines.

The reducing agents (including compounds referred to as developing agent or hydrazine derivative) are described in Japanese Patent Provisional Publications No. 61(1986)-83640, No. 61(1986)-188535, No. 61(1986)-228441, No. 2(1987)-86354, No. 62(1987)-86355, No. 62(1987)-264041 and No. 62(1987)-198849. The reducing agent is also described in T. James, "The Theory of the Photographic Process", 4th edition, pp. 291–334 (1977), Research Disclosure Vol. 170, No. 17029, pp. 9–15 (June 1978), and Research Disclosure Vol. 176, No. 17643, pp. 22–31 (December 1978).

A precursor of a reducing agent which releases the reducing agent when it is heated or in contact with a base can be used in place of the reducing agent.

These reducing agents can be used singly or in combination. In the case that two or more reducing agents are used in combination, certain interactions between the reducing agent maybe expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with the other reducing agent. Both interactions may occur simultaneously, so that it is difficult to determine which of the interactions has occurred in practical use.

Concrete examples of the reducing agent include pentadecylhydroquinone, 5-t-butylcatechol, p-(N,N-diethylamino)phenol, 1-phenyl 4-methyl-4-hydroxymethyl-3-pyrazolidone, 1-phenyl-4-methyl-4-heptadecylcarbonyloxymethyl-3-pyrazolidone, 2-phenyl-sulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphthol, 2-(N-methyl-N-octadecylcarbamoyl)-4-sulfonylaminonaphthol, 1-acetyl-2-phenylhydrazine, 1-acetyl-2{(p- or o)-aminophenyl}hydrazine, 1-formyl-2-{(p-or o)-aminophenyl}hydrazine, 1-acetyl-2-{(p- or o)-methoxy-phenyl}hydrazine, 1-lauroyl-2-{(p- or o-)aminophenyl}hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)-butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]-hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl hydrazine, 1-acetyl-2-[4-{2-(2,4-di-tert-pentylphenoxy)buty-lamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}-phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on 1 mole of silver (including the above-mentioned silver halide and the optional organic silver salt).

The reducing agent may be contained in the microcapsules and/or arranged outside of the microcapsules.

There is no specific limitation with respect to the polymerizable compound, except that the compound has an ethylenic unsaturated bond. Any known ethylenic unsaturated polymerizable compounds can be employed in the invention. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride maleic acid esters, itaconic acid esters, styrene, styrene derivatives, vinyl ethers, vinyl esters, N-vinyl heterocyclic compounds, allyl ethers allyl esters, and derivatives thereof.

Concrete examples of the acrylic esters include n.butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylpheny. loxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropionaldehyde and pentaerythritol condensate, polyacrylate of hydroxypolyether, polyester acrylate and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. The light-sensitive material containing mixture of two or more polymerizable compounds is described in Japanese Patent Provisional Publication No. 62(1987)-210445. Further, compounds formed by bonding a polymerizable group such as a vinyl group or a vinylidene group to a reducing agent is also employed as the polymerizable compounds. The light-sensitive materials using compounds which show functions as both the reducing agent and the polymerizable compound or both the color image forming substance and the polymerizable compound are included in embodiments of the light-sensitive material employable in the invention.

The amount of the polymerizable compound to be contained in the light-sensitive layer preferably ranges from 5 to 120,000 parts by weight, and more preferably from 12 to 12,000 parts by weight, per one part by weight of the silver halide grains.

In the light-sensitive material of the present invention, the silver halide and the polymerizable compound are contained in microcapsules which are dispersed in the light-sensitive layer. The reducing agent or the other components of the light-sensitive layer may be contained in the microcapsules.

There is no specific limitation on the shell materials of the microcapsules. The light-sensitive materials using microcapsules having polyamide resin and/or polyester resin shell are described in Japanese Patent Provisional Publication No. 62(1987)-209437. The light-sensitive materials using microcapsules having polyurea resin and/or polyurethane resin shell are described in Japanese Patent Provisional Publication No. 62(1987)-209438. The light-sensitive materials using microcapsules having amino-aldehyde resin shell are described in Japanese Patent Provisional Publication No. 62(1987)-209439. The light-sensitive materials using microcapsules having gelatin shell are described in Japanese Patent Provisional Publication No. 62(1987)-209440. The light-sensitive materials using microcapsules having epoxy resin shell are described in Japanese Patent Provisional Publication No. 62(1987)-209441. The light-sensitive materials using microcapsules having multilayer shell of polyamide resin and/or polyurea resin are described in Japanese Patent Provisional Publication No. 62(1987)-209447. The light-sensitive materials using microcapsules having multilayer shell of polyurethane resin and/or polyester resin are described in Japanese Patent Provisional Publication No. 62 (1987)-209447.

In the case of using the microcapsules of aldehyde type, the residue of aldehyde is preferably lower than a certain amount as in the light-sensitive materials described in Japanese Patent Provisional Publication No. 63(1988)-32535.

The silver halide preferably exist in the shell material of the microcapsule, as is described in Japanese Patent Provisional Publication No. 62(1987)-169147. The number of the silver halide grains to be contained in one microcapsule preferably is 5 or more, as is described in Japanese Patent Provisional Publication No. 63(1988)-15239.

There can be employed two or more kinds of microcapsules in combination which are different from each other in at least one component among the components capable of being contained in microcapsules such as a silver halide, a reducing agent, a polymerizable compound and a color image forming substance (optional component, described hereinafter). Especially in the case of forming a full-color image, three or more kinds of microcapsules having different color phases are preferably employed in combination. The light-sensitive materials using two or more kinds of microcapsules in combination are described in Japanese Patent Provisional Publication No. 62(1987)-198850.

The mean particle size of the microcapsules preferably is in the range of 3 to 20 $\mu$m. The microcapsule preferably has a homogeneous particle distribution as described in Japanese Patent Provisional Publication No. 63(1988)-5334. The thickness of the shell of the microcapsule preferably is larger than a certain value against the particle diameter of the microcapsule as described in Japanese Patent Provisional Publication No. 63(1988)-81336.

In the case that the silver halide grains are contained in microcapsules, the mean grain size of the silver halide preferably is not more than one fifth parts of the mean size of the microcapsules, more preferably not more than one tenth parts of the mean size of the microcapsules. When the mean size of the microcapsules is not more than one fifth parts of the mean grain size of silver halide, even and uniform image can be obtained.

The light-sensitive material can be prepared by arranging a light-sensitive layer containing the above-mentioned components on a support. There is no specific limitation with respect to the support. In the case that heat development is utilized in the use of the light-sensitive material, a material for the support preferably is resistant to heat given in the developing stage. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has a certain smoothness as described in Japanese Patent Provisional Publication No. 62(1987)-209529. As the paper sup port, there can be employed various paper supports such as a paper support having a low water absorption described in Japanese Patent Provisional Publication No. 63(1988)-38934; a paper support having a certain Bekk Smoothness described in Japanese Patent Provisional Publication No. 63(1988)-47754, a paper support having a low shrinkage ratio described in Japanese Patent Provisional Publication No. 63(1988)-81339; a paper support having a low permeation rate described in Japanese Patent Provisional Publication No. 63(1988)-81340, and a paper support having a pH value of 5 to 9 described in Japanese Patent Provisional Publication No. 673(1988)-97941.

The light-sensitive layer may further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes decolored by irradiation with light, matting agents, antismudging agents, plasticizers, water releasers, binders, photo polymerization initiators, solvents of the polymerizable compound, water soluble vinyl polymers and hardening agents.

In the light-sensitive material, a polymer image can be obtained on the light-sensitive layer having the above mentioned constitution. Further, a color image can be obtained on the light-sensitive layer by incorporating a color image forming substance as an optional component into the light-sensitive layer.

There is no specific limitation with respect to the color image forming substance, and various kinds of substances can be employed. Examples of the color image forming substance include colored substance (i.e., dyes and pigments) and non-colored or almost non-colored substance (i.e., color former or dye. or pigment-precursor) which develops to give a color under application of external energy (e.g., heating, pressing, light irradiation, etc.) or by contact with other components (i.e., developer). The light-sensitive materials using the color image forming substance are described in Japanese Patent Provisional Publication No. 61(1986)-73145. The light-sensitive material using a dye or pigment as the color image forming substance is described in Japanese Patent Provisional Publication No. 62(1987)-187346. The light-sensitive material using a leuco dye is described in Japanese Patent Provisional publication No. 62(1987)-209436. The light-sensitive material using a triazene compound is described in Japanese Patent Provisional Publication No. 62(1987)-251741. The light-sensitive material using a leuco dye which gives a yellow color is described in Japanese Patent Provisional Publication Nos. 62(1987)-288827 and 62(1987)-288828. The light sensitive material using a leuco dye which gives a cyan color is described in Japanese Patent Provisional Publication Nos. 63(1988)-53542. Examples of dyes and pigments (i.e., colored substance) employable in the invention include commercially available ones as well as various known compounds described in the technical publications, for example, Yuki Gosei Kagaku Kyokai (ed.), Handbook of Dyes (in Japanese, 1970) and Nippon Ganryo Gijutsu Kyokai(ed.,), New Handbook of pigments (in Japanese, 1977). Those dyes and pigments can be used in the form of a solution or dispersion.

Examples of the substances which develop to give a color by certain energy include thermochromic compounds, piezochromic compounds, photochromic compounds and leuco compounds derived from triarylmethane dyes, quinone dyes, indigoid dyes, azine dyes, etc. Those compounds can develop to give a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of color formation systems are described in Hiroyuki Moriga, "Introduction of Chemistry of Speciality Paper" (in Japanese, 1975), pp. 29–58 (pressure-sensitive copying paper, [pp. 87–95 (azography), pp. 118–120 (heat-sensitive color formation by a chemical change) or in MSS. of the seminar promoted by the Society of Kinki Chemical Industry, "The Newest Chemistry of Coloring Matter-Attractive Application and New Development as a Functional Coloring Matter", pp. 26–32 (June 19, 1980). Examples of the color formation systems specifically include a color formation system used in pressure sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance is preferably used in an amount of 0.5 to 50 parts by weight, more preferably 2 to 30 parts by weight, per 100 parts by weight of the polymerizable compound. In the case that the developer is employed, the amount of the developer is preferably in the range of approx. 0.3 to 80 parts by weight per one part by weight of the color former.

In the case of using two kinds of color image forming substances which give a color when they are brought into contact with each other (e.g., color former and a developer), one substance and the polymerizable compound are contained in the microcapsule, and the other is arranged outside of the microcapsule in the light-sensitive layer, with by a color image can be formed on the light-sensitive layer. The light-sensitive material in which a color image can be obtained without using an image-receiving material as described above is described in Japanese Patent Provisional Publication No. 62(1987)-209444.

There is no specific limitation with respect to the sensitizing dyes, and any known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be employed singly or in combination, but two or more sensitizing dyes are generally employed in combination for the purpose of supersensitization. In addition to the sensitizing dye, a substance which does not per se exhibit spectral sensitization effect or does not substantially absorb visible light but shows supersensitizing activity can be employed. The amount of the sensitizing dye to be added generally ranges from approx. $10^{-8}$ to $10^{-2}$ mole per 1 mole of the silver halide.

The sensitizing dye is preferably added during the stage of the preparation of the silver halide emulsion. The sensitizing dye can be added in the stage of the preparation of the silver halide grains as described in Japanese Patent Provisional Publication No. 62(1987)-947. The sensitizing dye can be also added in the stage of the preparation of the silver halide emulsion after preparing the silver halide grains as described in Japanese Patent Provisional Publication No. 62(1987)-210449. Concrete examples of the sensitizing dyes are described in Japanese Patent Provisional Publication Nos. 62(1987)-947 and 62(1987)-210449. The sensitizing dye having a sensitivity within the infrared region can be also employed in combination as described in Japanese Patent Provisional Publication No. 62(1987)-210449.

Adding of an organic silver salt to the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably located in contact with the silver halide or closely to the silver halide. Examples of organic compounds employable for forming such organic silver salt include aliphatic or aromatic carboxylic acids, thiocarbonyl group containing compounds having a mercapto group or an α-hydrogen atom, and imino group-containing compounds. Among them, benztriazoles are most preferred. The organic silver salt is generally used in an amount of from 0.01 to 10 mole, preferably from 0.01 to 1 mole, per 1 mole of the silver halide. Instead of the organic silver salt, an organic compound (i.g., benzotriazole) which can form an organic silver salt in combination with an inorganic silver salt can be added to the light-sensitive layer to obtain the same effect. The light-sensitive material using the organic silver salt is described in Japanese Patent Provisional Publication No. 62(1987)-3246. The above-mentioned organic silver salt is preferably used in an amount of 0.1 to 10 mole, more preferably 0.01 to 1 mole, per 1 mole of the silver halide.

A radical generator which accelerates (or inhibits) polymerization of the reducing agent may be contained in the light-sensitive layer. A light-sensitive material using a triazene silver as the radical generator is described in Japanese Patent Provisional Publication No. 62(1987)-195639. A light-sensitive material using a silver diazotate as the radical generator is described in Japanese Patent Provisional Publication No. 62(1987)-195640. A light-sensitive material using an azo compound as the radical generator is described in Japanese Patent Provisional Publication No. 62(1987)-195641.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer (described hereinafter), or a similar function. The image formation accelerators can be classified into inorganic bases, organic bases, base precursors, oils, surface active agents, compounds functioning as an antifogging ventsagent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines(e.g., N-alkyl-substituted aromatic amines, N-hydroxylalkyl-substituted aromatic amines and bis[p-(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Examples of the base precursors include guanidine trichloroacetate, piperidine trichloroacetate, morpholine trichloroacetate, p-toluidine trichloroacetate, 2-picoline trichloroacetate, guanidine phenylsulfonyl-acetate, guanidine 4-chlorophenyl sulfonylacetate, guanidine 4-methyl-sulfonylphenylsulfonyl. acetate, and guanidine 4-acetylaminomethyl propionate.

The bases or the base precursors can be employed in the amount of wide range in the light-sensitive material. The base or base precursor is preferably employed in an amount of not more than 100% by weight, more preferably from 0.1 to 40% by weight, based on the total solid content of the light-sensitive layer. These bases or base precursors can be used singly or in combination.

The light-sensitive material employing the base or base precursors is described in Japanese Patent Provisional Publication No. 62(1987)-264041. The light-sensitive material employing a tertiary amine as the base or base precursor is described in Japanese Patent Provisional Publication No. 62(1987)-170954. The light-sensitive material employing dispersed grains of hydrophobic base compound having a melting point of 80° C. to 180° C. is described in Japanese Patent Provisional Publication No. 62(1987)-209523. The light-sensitive material employing guanidine derivatives having a solubility of not more than 0.1 % is described in Japanese Patent Provisional Publication No. 62(1987)-215637. The light-sensitive material employing hydroxydes of alkali metals or alkaline earth metals or salt is described in Japanese Patent Provisional Publication No. 62(1987)-209448.

The light-sensitive material employing acetylide compounds as the base precursor is described in Japanese Patent Provisional Publication No. 63(1988)-24242. The light-sensitive material employing salts of propiolic acid as the base precursor and further containing silver, copper, silver compound or copper compound as the catalyst of the base production reaction is described in Japanese Patent Provisional Publication No. 63(1988)-46446. The light-sensitive material containing the salts of propiolic acid under the condition of being separated from the silver, copper, silver compound or copper compound is described in Japanese Patent Provisional Publication No. 3(1988)-81338. The light-sensitive material containing free ligands in addition to the salts of propiolic acid and the silver, copper, silver compound or copper compound is described in Japanese Patent Provisional Publication No. 3(1988)-97942. The light-sensitive material employing salts of the propiolic acid as the base precursor and further containing heat fusible compounds as the accelerator of the base production reaction is described in Japanese Patent Provisional Publication No. 63(1988)-46447. The light-sensitive material employing salts of sulfonyl acetate as the base precursor and further containing heat fusible compounds as the accerelator of the base production reaction is described in Japanese Patent Provisional Publication No. 63(1988)-48543. The light-sensitive material employing compounds in which isocyanate or isothiocyanate is bonded to organic base is described in Japanese Patent Provisional Publication No. 63(1988)-24242.

In the case of using the base or the base precursor in the light-sensitive material, it is preferred that the silver halide, the reducing agent and the polymerizable compound are contained in the aforementioned microcapsules, and the base or base precursor is arranged outside of the microcapsule in the light-sensitive layer. Otherwise, the base or base precursor can be contained in different microcapsules from those containing the polymerizable compound as described in Japanese Patent Provisional Publication No. 62(1987)-209521. The base or base precursor can be contained in the microcapsules under the condition that the base or base precursor is dissolved or dispersed in an aqueous solution of a water retention agent as described in Japanese Patent Provisional Publication No. 62(1987)-209522, or under condition that the base or base precursor is adsorbed on solid particles as described in Japanese Patent Provisional Publication No. 62(1987)-209526. The base or base precursor contained in the microcapsules preferably has a melting point in the range of 70° to 210° C. as described in Japanese Patent Provisional Publication No. 63(1988)-65437. Further, the base or base precursor can be dissolved ingrains in combination with hydrophobic substance as described in Japanese Patent Provisional Publication No. 63(1988)-97943.

The base or base precursor can be contained in a layer different from the light-sensitive layer as described in Japanese Patent Provisional Publication No. 62(1987)-253140. The layer containing base or base precursor will be described hereinafter. Further, the base or base precursor may be contained in the aforementioned porous support as described in Japanese Patent Provisional Publication No. 63(1988)-32546.

According to the present invention, the base or base precursor can be adsorbed on the surface of the microcapsules by using the above-mentioned cationic polymer.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator can be used to give an image of high sharpness having a high maximum density and a low minimum density (i.e., an image having high S/N ratio). Examples of the compounds functioning as an antifogging agent and/or a development accelerator include a conventional antifogging agent described in Japanese Patent Provisional Publication No. 62(1987)-151838; a compound having a cyclic amido structure described in Japanese Patent Provisional Publication No. 61(1986)-151841; a thioether compound described in Japanese Patent Provisional Publication No. 62(1987)-151842; a polyethylene glycol derivative described in Japanese Patent Provisional Publication No. (1987)-151843; a thiol derivative described in Japanese Patent Provisional Publication No. 62(1987)-151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

The hot-melt solvents preferably are compounds which may be used as a solvent of the reducing agent or those which have high dielectric constant and can accelerate physical development of silver salts. Examples of the hot. melt solvents include polyethylene glycols, derivatives of polyethylene oxides (e.g., oleate ester), bees wax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure, pp. 26-28 (December 1976). The light-sensitive material employing the hot-melt solvent is described in Japanese Patent Provisional Publication No. 62(1987)-86355.

The compounds functioning as an antioxidant can be employed for the purpose of eliminating the oxygen influence (oxygen has a function as a polymerization inhibitor). An example of the compounds functioning as an antioxidant is a compound having two or more mercapto groups as described in Japanese Patent Provisional Publication No. 62(1987)-209443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisiso-butyrate, 2,2'-azobis(2-methylbutyronitrile), and azobis-dimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiator is preferably used in an amount of from 0.1 to 120% by weight, more preferably from 1 to 10% by weight, based on the amount of the polymerizable compound. In a system in which the polymerizable compound within the area where the latent image has but been formed is polymerized, the thermal polymerization initiators are preferably incorporated into the light-sensitive layer. The light-sensitive material using the thermal polymerization initiators is described in Japanese Patent Provisional Publication No. 62(1987)-70836.

The development stopping agents employable in the light-sensitive material are compounds that neutralize a base or react with a base to reduce the base concentration in the layer to hereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

For the purpose of anti-halation or anti-irradiation, dyes or pigments can be added to the light-sensitive layer of the light-sensitive material. The light-sensitive material comprising the light-sensitive layer which contains white pigment for the purpose of anti-halation or anti irradiation is described in Japanese Patent Provisional Publication No. 63(1988)-29748.

In the case that the light-sensitive layer of the light-sensitive material employes microcapsules, the dyes having properties of being decolorized when it is heated or irradiated with light can be used. The dyes having such properties can be used in the light-sensitive material as a yellow filter layer in a conventional silver salt photographic system. The light-sensitive material employing the dyes having the above properties is described in Japanese Patent Provisional Publication No. 63(1988)-97940.

The antismudging agents employable in the light-sensitive tive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of the particle is preferably larger than that of the microcapsule. In the case that the oily droplets of the polymerizable compound is in the form of microcapsules, the size of the particle is preferably larger than that of the micro-capsule.

The binder employable in the light-sensitive material can be contained in the light-sensitive layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed. The binder is preferably employed in an amount of 2 to 100 wt. % based on the amount of the polymerizable compound. The light-sensitive material using the binder is described in Japanese Patent Provisional Publication No. 61(1986)-69062. The light-sensitive material using both of the binder and the microcapsules is described in Japanese Patent Provisional Publication No. 62(1987)-209525.

In the light-sensitive material employable in the invention, a hydrophilic binder is preferably used as the binder in combination with a hardener. When the hydrophilic binder is hardened, the light-sensitive layer containing a liquid such as water can be enhanced in the physical properties.

There is no specific limitation on the hardening agent employable in the light-sensitive material. Examples of known hardening agent include aldehydes such as formaldehyde, glyoxal and glutaraldehyde, N-methylol compounds such as dimethylol urea and methylol dimethyl-hydantoin, dioxane derivatives such as 2,3-dihydroxy-dioxane, active vinyl compounds such as 1,3,5-triacryloyl-hexahydro-s-triazine, bis(vinylsulfonylacetamide) and N,N'-trimethylene. bis(vinylsulfonylacetamide), active halogen compounds such as 2,4-dichloro-6-hydroxy-s-triazine, mucohalogen acids such as mucochloric acid and mucopheonxychloric acid, iso-oxazoles, dialdehyde starch, 1-chloro-6-hydroxytriazinylated gelatin, and epoxy compounds (such as

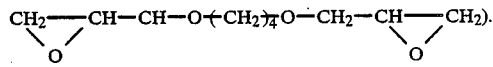

The hardening agent is preferably employed in an amount of 0.1 to 30 wt. %, more preferably 0.5 to 10 wt. %, of the hydrophilic binder.

A photopolymerization initiator can be contained in the light-sensitive layer of the light-sensitive material for the purpose of polymerization of the transferred unpolymerized polymerizable compound, as described in Japanese Patent Provisional Publication No. 62(1987)-161149.

In the case of using a solvent for the polymerizable compound, the solvent is preferably contained in a microcapsule which is different from the microcapsule containing the polymerizable compound. The light-sensitive material employing a polymerizable compound contained in a microcapsule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Provisional Publication No. 63(1988)-91652.

Examples and usage of other components than the above-mentioned ones which can be optionally contained in the light-sensitive layer are also described in the above-mentioned publications concerning the light-sensitive material, and in Research Disclosure Vol. 170, No. 17029, pp. 9–15 (June 1978).

The light-sensitive layer of the light-sensitive material comprising the above-mentioned components preferably has a pH value of not more than 7 as described in Japanese Patent Provisional Publication No. 62(1987)-275235.

Examples of auxiliary layers which are optionally arranged on the light-sensitive material include an image receiving layer, a heating layer, an antistatic layer, an anti-curling layer, a peel layer, a cover sheet, a protective layer, a layer containing a base or a base precursor, a base barrier layer and an anti-halation layer (colored layer).

Instead of using an image receiving material (described later), the above-mentioned image-receiving layer can be provided on the light-sensitive material to form an image on the image-receiving layer. The structure of the image-receiving layer provided on the light-sensitive material can be the same as that of the image-receiving material.

The light-sensitive material using a heating layer is described in Japanese Patent Provisional Publication No. 61(1986)-294434. The light-sensitive material provided with a cover sheet or a protective layer is described in Japanese Patent Provisional Publication No. 62(1987)-210447. The light-sensitive material provided a layer containing a base or base precursor is described in Japanese Patent Provisional Publication No. 62(1987)-253140. The light-sensitive material provided with a colored layer as the anti-halation layer is described in Japanese Patent Provisional Publication No. 63(1988)-101842. The light-sensitive material provided with a base barrier layer is described in Japanese Patent Provisional Publication No. 2(1987)-253140. Examples of other auxiliary layers and usage thereof are described in the above-mentioned publications concerning the light-sensitive materials.

The process for the preparation of a light-sensitive material is described below.

Various processes can be employed for preparing a light-sensitive material. In a generally known process, a light-sensitive material can be prepared by dissolving, emulsifying or dispersing each of the components of the light-sensitive layer in an adequate solvent to obtain a coating solution, then applying the solution onto the aforementioned support, and drying the coated layer of the solution.

The coating solution can be generally prepared by preparing liquid compositions each composition containing each component and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-142329 and 55(1980)-158124 and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Provisional Publication No. 58(1983)-3534 and Japanese Patent Publication No. 58(1983)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, polyvinyl alcohol partial acetal, poly-N-vinylpyrrolidone polyacrylic acid, polymethacrylic acid, polyacrylamide, polyvinylimidazole, and polyvinylpyrazole and copolymers comprising monomers constituting these homopolymers. Among them, gelatin is most preferred. Examples of the employable gelatin include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1987)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc, singly or in combination. Those chemical sensitization processes can be carried out in the presence of a nitrogen-containing heterocyclic compound as described in Japanese Patent Provisional Publications Nos. 58(1983)-126526 and 58(1983)-215644.

When a sensitizing dye is added to the silver halide emulsion, the sensitizing dye is preferably added during the stage of preparation of the emulsion as described in the above-mentioned Japanese Patent Provisional Publication Nos. 62(1987)-947 and 62(1987)-210449. When the nitrogen containing heterocyclic compound functioning as an antifogging agent and/or a development accerelator is added to the silver halide emulsion, the compound is preferably added during the stage of the formation or ripening of the silver halide grains. The process for the preparation of the light-sensitive material employing the nitrogen-containing heterocyclic compound of described in Japanese Patent Provisional Publication No. 62(1987)-161144.

When the organic silver salt is contained in the light-sensitive layer, the emulsion of the organic silver salt can be prepared in the similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent, color image forming substance, and the like can be dissolved or emulsified in the polymerizable compound. Especially when the color image forming substance is used, the substance is preferably introduced into the polymerizable compound. Further, the components of the shell material may be contained in the polymerizable compound.

A light-sensitive composition containing the polymerizable compound which contains the silver halide can be prepared using the silver halide emulsion. Otherwise, a silver halide powder prepared by lyophilization can be also employed other than the silver halide emulsion to prepare the light-sensitive composition. The light-sensitive composition can be obtained by stirring the polymerizable compound and the silver halide using a homogenizer, a blender, a mixer or other conventional stirring device.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041.

The above-mentioned light-sensitive composition which contains the silver halide and the polymerizable compound is preferably employed in the form of an emulsion in which the composition is emulsified in an aqueous medium. It is preferred that the shell material required for the preparation of microcapsules is added to the emulsion and the emulsion is then subjected to a process for forming a shell of microcapsule, as described in Japanese Patent Provisional Publication No. 61(1986)-275742.

Examples of the processes for preparing microcapsules (encapsulation processes) include a process utilizing coacervation of a hydrophilic shell material as described in U.S. Pat. Nos. 2,800,457 and 2,800,458; an interface polymerization process as described in U.S. Pat. No. 3,287,154, British Patent No. 990,443, and Japanese Patent Publication Nos. 38(1963)-19574, 42(1967)-446 and 42(1967)-771; a polymer deposition process as described in U.S. Pat. Nos. 3,418,250 and 3,660,304; a process using an isocyanate-polyol shell material as described in U.S. Pat. No. 3,796,669; a process using an isocyanate shell material as described in U.S. Pat. No. 3,914,511; a process using an urea-formaldehyde or urea-formaldehyde-resorcinol shell material as described in U.S. Pat. Nos. 4,001,140, 4,087,376 and 4,089,802; a process using a shell material such as melamine-formaldehyde resin or hydroxypropyl cellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerization-dispersion cooling process as described in U.K. Patent Nos. 927,807 and 965,074; and a spray-drying process as described in U.S. Pat. No. 3,111,407 and U.K. Patent No. 930,422. The process for encapsulation of oily droplets of the polymerizable compound is by no means restricted to the above-mentioned processes, but most preferred is a process comprising emulsifying a core material and then forming a polymer film as a shell of the microcapsule around the core material.

Another silver halide emulsion is added to the obtained dispersion of the microcapsules to prepare a coating solution for a light-sensitive layer. The coating solution is coated over a support, and the coated layer of the solution is dried to prepare a light-sensitive material.

Use of the light-sensitive material of the present invention is described below.

The image forming method (namely use of the light-sensitive material) comprises imagewise exposing to light the light-sensitive material and developing the light-sensitive material to form a polymer image.

Various exposure means can be employed in the imagewise exposure, and in general, a latent image of the silver halide is obtained by imagewise exposure to radiation including visible light. The kind of light source or the amount of light employed in the exposure can be selected depending on the light-sensitive wavelength determined by spectral sensitization or sensitivity of silver halide. An original image can be either monochromatic image or color image.

Development of the light-sensitive material can be conducted simultaneously with or after the imagewise exposure. The development can be conducted using a developing solution in the same manner as the image forming method described in Japanese Patent Publication No. 45-(1970)-11149. The image forming method described in Japanese Patent Provisional Publication No. 61(1986)-69062 which employs a heat development process has an advantage of simple procedures and short processing time. Therefore, the latter method is preferred as the development process of the light-sensitive material.

Heating in the heat development process can be conducted in various known manners. The heating layer which is arranged on the light-sensitive material can be used as the heating means. Heating temperature for the development process usually ranges from 80° C. to 200° C., and preferably from 100° C. to 160° C. Various heating patterns are applicable. The heating time is usually from 1 second to 5 minutes, and preferably from 5 seconds to 1 minutes.

In the above-mentioned development process, a polymer image can be formed on the light-sensitive layer. A color image can be also obtained by fixing a dye or pigment on the polymer image.

As described in Japanese Patent Provisional Publication No. 62(1987)-209444, a color image can be also formed on the light-sensitive material using two kinds of substances which form a color when brought into contact with each other. In this method, one of the substances is contained in microcapsules dispersed in the light-sensitive layer and the other is arranged outside of the microcapsules, and the light-sensitive material having been subjected to the development process is pressed to rupture the microcapsules so as to being into contact the two kinds of substances with each other.

An image-receiving material can be employed to form a polymer image.

After the development process, the light-sensitive is pressed on an image-receiving material to transfer the unpolymerized polymerizable compound to the image-receiving material, whereby a polymer image can be formed on the image-receiving material. For applying a pressure on the light-sensitive material, various known methods can be employed.

In the case that the light-sensitive layer contains a color image forming substance, the light-sensitive material is subjected to the heat development process to cure the polymerizable compound, and thereby the color image forming substance in the cured portion is fixed. Then, the light-sensitive material is pressed on an image-receiving material to transfer the color image forming substance in the uncured portion to the image-receiving material. Thus, a color image can be formed on the image-receiving material.

After the image is formed on the image-receiving material, the image-receiving material can be heated to polymerize the transferred unpolymerized polymerizable compound as described in Japanese Patent Provisional Publication No. 62(1987)-210459. Through the above-mentioned process, the obtained image can be improved in the preservability.

Various image recording apparatus can be used for the image-forming method. An example of the apparatus comprises an exposure device for imagewise exposing the light sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The image-receiving material employable in the above-mentioned image-forming method is described below.

As the support of the image-receiving material, there can be employed a baryta paper in addition to various materials employable as the support of the light-sensitive material. In the case that a porous material such as paper is employed as the support of the image-receiving material, the porous support preferably has a certain smoothness as described in Japanese Patent Provisional Publication No. 62(1987)-209530. An image-receiving material employing a transparent support is described in Japanese Patent Publication No. 62(1987)-209531.

The image-receiving material is usually prepared by providing an image-receiving layer on the support. The image-receiving layer can be constructed using a variety of compounds according to the color formation system. In the cases that polymer image is formed on the image-receiving material and that a dye or pigment is employed as the color image forming substance, the image-receiving material can be composed of the support only.

For example, when a color formation system using a color former and a developer is employed, the developer can be contained in the image-receiving layer. Otherwise, the image-receiving layer can be composed of at least one layer containing a mordant. The mordant can be selected from various compounds which are known in the art of the conventional photography in consideration of nature of the color image forming substance. If desired, the image-receiving layer can be composed of two or more layers containing a plurality of mordants different from each other in the mordanting power.

The image-receiving layer preferably contains a polymer as a binder. The binder which is employable for the aforementioned light-sensitive layer can be also employed for the image-receiving layer. Further, a polymer having a lower transmission coefficient of oxygen can be used as the binder, as described in Japanese Patent Provisional Publication No. 62(1987)-209454.

The image-receiving layer can contain a thermoplastic compound. In the case that the thermoplastic compound is contained in the image-receiving layer, the image-receiving layer itself is preferably composed of an agglomerate of fine particles of the thermoplastic compound (i.e., granulated thermoplastic compound). The image-receiving layer having the above constitute has such advantages that the formation of a transferred image can be readily done and a glossy image can be obtained under heating after the image formation.

The image-receiving material having an image-receiving layer containing the granulated thermoplastic compound is described in Japanese Patent Provisional Publication Nos. 62(1987)-280071 and 62(1987)-280739.

A photopolymerization initiator or a thermal polymerization initiator may be contained in the image-receiving layer. In the image-formation process using an image-receiving material, a color image forming substance is transferred together with the unpolymerized polymerizable compound as described hereinafter, so that the photopolymerization initiator or thermal polymerization initiator can be contained in the image-receiving layer to smoothly perform the curing procedure (fixing procedure) of the unpolymerized polymerizable compound. The image-receiving material having the image-receiving layer containing a photopolymerization initiator is described in Japanese Patent Provisional Publication No. 62(1987)-161149. The image-receiving layer containing a thermal polymerization initiator is described in Japanese Patent Provisional Publication No. 62(1987)-210444.

A dye or pigment can be contained in the image-receiving layer for the purpose of entering letters, symbols, frames, etc. in the image-receiving layer, or of giving a certain color to the background for the image. Further, the dye or pigment can be also employed for the purpose of making it easy to distinguish the sides of the image-receiving material. As the dye or pigment, there can be employed a variety of known dyes or pigments employable for the image formation. However, in the case that the dye or pigment may disturb the image formed on the image receiving layer, it is preferred to make the density of the dye or pigment low (e.g., reflection density of not higher than 1), or to employ a dye or pigment having a property of being discolored when it is heated or irradiated with light. The image-receiving material comprising the image-receiving layer which contains a dye or pigment having a property of being discolored when it is heated or irradiated with light is disclosed in Japanese Patent Provisional Publication No. 62(1987)-251741.

Further, when a white pigment such as titanium dioxide and barium sulfate is contained in the image-receiving layer, the image-receiving layer can function as a white reflection layer. In this case, the white pigment is used in an amount of 10 to 100 g based on 1 g of the thermoplastic compound.

The above-mentioned dye and pigment can be either completely or partially contained in the image-receiving layer. For example, when the support is composed of transparent material the white pigment be partially contained in the image-receiving layer to make a part of a reflection image transparent. Thus, information of the image which is unnecessary in the transparent image can be entered in the part of the image-receiving layer containing the white pigment as a reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer composed of an agglomerate of granulated thermoplastic compound can be also provided on the surface of the image-receiving layer as described in Japanese Patent Provisional Publication No. 62(1987)-210460.

Further, other various layers such as a layer containing a self-adhesive or adhesive and a release paper can be laminated on the surface of the support not facing the image-receiving layer. A sticker type image-receiving material having the above structure is described in Japanese Patent Provisional Publication No. 63(1988)-24647.

The light-sensitive material of the invention can be used for monochromatic or color photography, printing, radiography, medical diagnosis (e.g., CRT photography of diagnostic device using ultrasonic wave), copy (e.g., computer-graphic hard copy), etc.

The present invention is further described by the following examples without limiting the invention.

EXAMPLE 1

Preparation of silver halide emulsion (A)

In 1,200 ml of water were dissolved 24 g of gelatin and 1.2 g of sodium chloride, and the resulting gelatin solution was adjusted to pH 3.2 using 1 N sulfuric acid and kept at 60° C. To the gelatin solution, 200 ml of aqueous solution containing 20.5 g of potassium bromide and 200 ml of aqueous solution containing 0.25 mole of silver nitrate were added simultaneously at the same feed rate over 5 minutes. After 5 minutes, to the mixture, 600 ml of aqueous solution containing 47.5 g of potassium bromide and 8.6 g of sodium chloride and 600 ml of aqueous solution containing 0.49 mole of silver nitrate were added simultaneously at the same feed rate over 15 minutes. After 1 minute, to the mixture was added 47 ml of 1 % methanol solution of the following sensitizing dye (A). The mixture was stirred for 15 minutes. To the emulsion was added 1.2 g of isobutylene/monosodium maleate copolymer for sedimentation. The emulsion was washed with water for desalting. Then, 24 g of gelatin was dissolved in the emulsion. Further, 5 mg of sodium thiosulfate was added to the emulsion for chemical sensitization at 60° C. for 15 minutes to obtain a silver halide emulsion (A). The yield of the emulsion was 1,000 g.

Sensitizing dye (A)

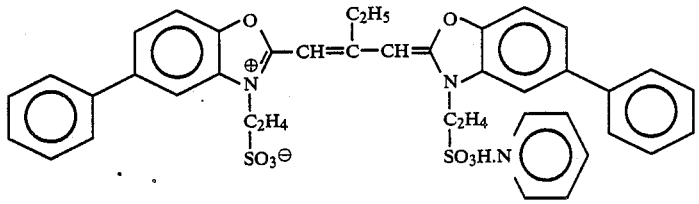

Preparation of light-sensitive composition

In 100 g of trimethylolpropane triacrylate were dissolved 1.2 g of the following copolymer, 10 g of Pargascript Red I-6-B (tradename of Ciba-Geigy) and 1.8 g of Emulex NP-8 (tradename of Nippon Emulsion Co., Ltd.).

In 18 g of the resulting solution were added 1.2 g of the following reducing agent (I) and 1.3 g of the following reducing agent (II). To the mixture was further added a solution in which 1.5 mg of the following mercapto compound is dissolved in 4 g of methylene chloride.

To the solution was added 2 g of the above-obtained silver halide emulsion (A), and the mixture was stirred at 15,000 r.p.m. for 5 minutes using a homogenizer to obtain a light-sensitive composition.

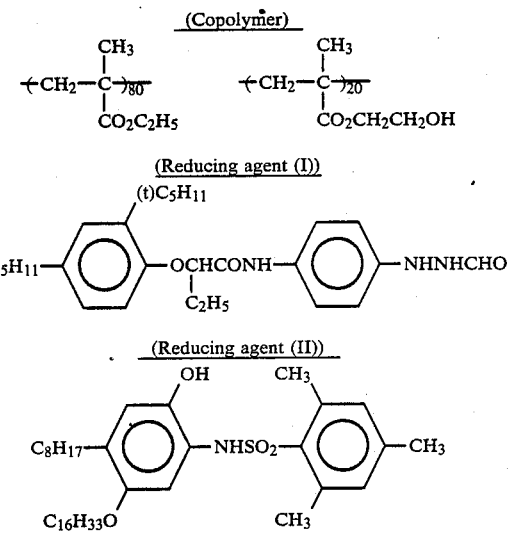

(Mercapto compound)

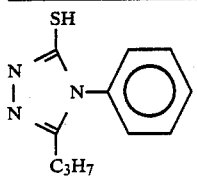

Preparation of light-sensitive microcapsule dispersion

To the light-sensitive composition was added 0.9 g of a polyisocyanate compound (Takenate D110N of Takeda Chemical Industries, Ltd.). The resulting mixture was added to 10% aqueous solution of partial sodium salt of polyvinylbenzene sulfonic acid (trade name: VERSA TL-502, available from National Starch, Co.) having been adjusted to pH 6.0 using 10% aqueous solution of sodium hydroxide. The resulting mixture was stirred at 7,000 r.p.m. for 30 minutes at 40° C. using a homogenizer to obtain a W/O/W emulsion in which the oily droplets has a thin polyurea resin shell.

Independently, to 13.2 g of melamine were added 21.6 g of 37% aqueous solution of formaldehyde and 70.8 g of water, and the resulting mixture was stirred at 60° C. for 30 minutes to obtain a transparent melamine-formaldehyde precondensate.

To the above-prepared W/O/W emulsion was added 8.7 g of the precondensate, and the resulting mixture was adjusted to pH 6.0 using a 20% aqueous solution of phosphoric acid under stirring. The mixture was then heated to 60° C. and stirred for 120 minutes to obtain a light-sensitive microcapsule dispersion containing microcapsules having polyurea resin inner shell and melamine formaldehyde resin outer shell.

Preparation of paper support

In a refiner, 20 weight parts of laubholz bleached sulfite pulp (LBSP) and 80 weight parts of laubholz bleached kraft pulp (LBKP) were beaten to obtain a pulp having Canadian standard freeness of 290 cc. To the resulting pulp were added 0.3 weight part of an alkylketene dimer (Aquapel 12, trademark of DIC-HERCULES Co., Ltd.) as a neutral size, 0.5 weight part of polyamide-polyamine-epichlorohydrin (Kymene 557, trademark of DIC-HERCULES Co., Ltd.) as a fixing agent and 0.5 weight part of cationated polyacrylamide (Polystrone, trademark of Arakawa Chemical Industry, Co., Ltd.) as paper strengthening agent to obtain a paper stuff, in which the part was a dry weight ratio to one part of pulp. A base paper sheet having basis weight of 60 g/m² and thickness of 66 μm was prepared from the obtained paper stuff using Fourdrinier paper machine.

On the surface (felt side) of the base paper sheet was coated polyvinylidene chloride in a coating amount of 16 g/m² using air-knife coating method to form a moisture-proofing layer. On the surface of the moisture-proofing layer was coated a mixture of 100 weight parts of SBR latex (SN-304, produced by Sumitomo Naugatac Co., Ltd.), 1 weight part of sodium polyacrylate (Arone T 40, produced by Toagosei Chemical Industry Co., Ltd.), 200 weight parts of clay (UW-90, produced by Engelhard Co., Ltd.) and 100 weight parts of petroleum resin (Carbomule R produced by DIC-HERCULES Co., Ltd.) in a coating amount of 5 g/m² using air-knife coating method to obtain a paper support.

Preparation of light-sensitive material (I)

To 160 g of 1% aqueous solution of gelatin was added 40 g of the following base precursor. The mixture was stirred in Dynomill dispersing device to obtain a dispersion of the base precursor.

To 10 g of the above-prepared microcapsule dispersions were added 5% aqueous solution of Emulex NP-8 (tradename of Nippon Emulsion Co., Ltd.) and 2.2 g of the dispersion of the base precursor. To the mixture was further added 3 g of 20% aqueous solution of the following hot-melt solvent and 0.2 g of the silver halide emulsion (A) to prepare a coating solution for a light-sensitive layer.

The coating solution was coated over the above-prepared paper support in coating amount of 50 g/m² to form a light-sensitive layer. The coated layer was dried at about 40° C. to prepare a light-sensitive material (I).

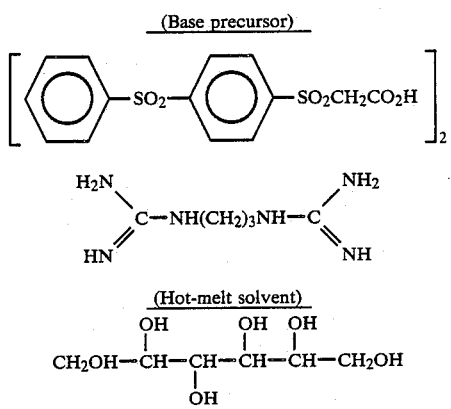

EXAMPLE 2

Preparation of silver halide emulsion (B)

In 1,200 ml of water were dissolved 24 g of gelatin and 1.2 g of sodium chloride, and the resulting gelatin solution was adjusted to pH 3.2 using 1 N sulfuric acid and kept at 60° C. To the gelatin solution, 600 ml of aqueous solution containing 117 g of potassium bromide and 600 ml of aqueous solution containing 0.74 mole of silver nitrate were added simultaneously at the same feed rate over 15 minutes. After 5 minutes, to the mixture, 200 ml of aqueous solution containing 4.3 g of potassium iodide was added over 5 minutes. To the emulsion was added 1.2 g of isobutylene/monosodium maleate copolymer for sedimentation. The emulsion was washed with water for desalting. Then, 24 g of gelatin was dissolved in the emulsion. Further, 5 ml of 0.05% aqueous solution of aminoiminomethanesulfinic acid (fogging agent) and 1 ml of 0.1% aqueous solution of chloroauric acid were added to the emulsion for ripening at 60° C. for 30 minutes to obtain a fogged silver halide emulsion (B). The yield of the emulsion was 1,000 g.

Preparation of light-sensitive material (II)

A light-sensitive material (II) was prepared in the same manner as in the Example 1 except that 0.2 g of the above-prepared silver halide emulsion (B) was used in place of 0.2 g of the silver halide emulsion (A) which was added to the coating solution of the light-sensitive layer.

COMPARISON EXAMPLE 1

Preparation of light-sensitive material (III)

A light-sensitive material (III) was prepared in the same manner as in the Example 1 except that the silver halide emulsion is not added to the coating solution of the light-sensitive layer.

Preparation of image-receiving material

To 125 g of water was added 11 g of 40% aqueous solution of sodium hexametaphosphate, and to the mixture were further added 34 g of zinc 3,5-di-α-methylbenzylsalicylate and 82 g of 55% slurry of calcium carbonate, followed by coarsely dispersing in a mixer. The resulting coarse dispersion was then finely dispersed in Dynomill dispersing device. To 200 g of the resulting dispersion was added 122 g of 8% aqueous solution of polyvinyl alcohol, and the resulting mixture was made uniform to give a coating solution for an image-receiving layer. The coating solution was uniformly coated on an art paper having basis weight of 3 g/m$^2$ to give a coating layer having wet thickness of 30 μm. The coated layer was dried to prepare an image-receiving material.

Evaluation of the light-sensitive material

The light-sensitive materials prepared in Examples 1 & 2 and Comparison Example 1 were stored in a refrigerator at 5° C. for 30 days.

Each of the light-sensitive materials was then imagewise exposed to light using a tungsten lamp at 2,000 lux for 1 second. Each of the light-sensitive materials was heated on a hot plate at 155° C. for 10 seconds. Each of the light-sensitive materials was then combined with the image-receiving material and they were pressed through a press roller at pressure of 450 kg/cm$^2$ to obtain an image on the image receiving material. The maximum density (Dmax) and the minimum density (Dmin) of the image were measured by using Macbeth reflection densitometer. The results are set forth in Table 1.

Separately, the light-sensitive materials were stored at 5° C. and relative humidity of 60% for 30 days. The image was then formed on the image-receiving material using each of the light-sensitive materials in the same manner as is mentioned above. The maximum density (Dmax) and the minimum density (Dmin) of the image were measured by using Macbeth reflection densitometer. The results are set forth in Table 2.

In Tables 1 & 2, "Silver Halide" indicates the kind of the silver halide contained in the microcapsules (Inside) and the kind of the silver halide arranged outside of the microcapsules (Outside).

TABLE 1

| Light-sensitive Material | Silver Halide Inside | Silver Halide Outside | Maximum Density | Minimum Density |
|---|---|---|---|---|
| (I) | (A) | (A) | 1.22 | 0.07 |
| (II) | (A) | (B) | 1.18 | 0.07 |
| (III) | (A) | — | 1.20 | 0.12 |

TABLE 2

| Light-sensitive Material | Silver Halide Inside | Silver Halide Outside | Maximum Density | Minimum Density |
|---|---|---|---|---|
| (I) | (A) | (A) | 1.33 | 0.10 |
| (II) | (A) | (B) | 1.31 | 0.09 |

TABLE 2-continued

| Light-sensitive Material | Silver Halide Inside | Silver Halide Outside | Maximum Density | Minimum Density |
|---|---|---|---|---|
| (III) | (A) | — | 1.30 | 0.25 |

It is apparent from the results shown in Tables 1 & 2 that the light-sensitive materials of the present invention containing silver halide arranged outside of the microcapsules give a clear image having a high contrast, even if the materials are stored under severe conditions (high temperature and high humidity).

Further, the light-sensitive materials prepared in Examples 1 & 2 and Comparison Example 1 were stored in a refrigerator at 5° C. for 30 days.

Each of the light-sensitive materials was then imagewise exposed to light using a tungsten lamp at 2,000 lux for 1 second. Each of the light-sensitive materials was heated on a hot plate at 150° C., 155° C. or 160° C. for 10 seconds. Each of the light-sensitive materials was then combined with the image-receiving material and they were pressed through a press roller at pressure of 450 kg/cm$^2$ to obtain an image on the image receiving material. The maximum density (Dmax) and the minimum density (Dmin) of the image were measured by using Macbeth reflection densitometer. The results are set forth in Table 3.

TABLE 3

| Light-sensitive Material | Heating Temperature | Maximum Density | Minimum Density |
|---|---|---|---|
| (I) | 150° C. | 1.38 | 0.24 |
| (I) | 155° C. | 1.24 | 0.07 |
| (I) | 160° C. | 1.10 | 0.05 |
| (II) | 150° C. | 1.40 | 0.25 |
| (II) | 155° C. | 1.18 | 0.08 |
| (II) | 160° C. | 1.10 | 0.05 |
| (III) | 150° C. | 1.35 | 0.28 |
| (III) | 155° C. | 1.22 | 0.14 |
| (III) | 160° C. | 0.99 | 0.13 |

It is apparent from the results shown in Table 3 that the light-sensitive materials of the present invention containing silver halide arranged outside of the microcapsules give a clear image having a high contrast, even if the materials are heated at a relatively high temperature in the development process.

EXAMPLE 3

1. Preparation of red-sensitive microcapsule

Preparation of silver halide emulsion (C)

In 1,200 ml of water were dissolved 24 g of gelatin and 1.2 g of sodium chloride, and the resulting gelatin solution was kept at 60° C. To the gelatin solution, 600 ml of aqueous solution containing 87.6 g of potassium bromide and 2.2 g of potassium iodide and 600 ml of aqueous solution containing 0.74 mole of silver nitrate were added simultaneously at the same feed rate over 15 minutes. After 1 minute, to the mixture was added 90 ml of 0.5% methanol solution of the following sensitizing dye. The mixture was stirred for 15 minutes at 60° C. To the emulsion was added 1.2 g of isobutylene/-monosodium maleate copolymer for sedimentation at 40° C. The emulsion was washed with water for desalting. Then, 24 g of gelatin was dissolved in the emulsion. Further, 2.5 mg of sodium thiosulfate was added to the emulsion for chemical sensitization at 60° C. for 40 minutes to obtain a silver halide emulsion (C). The yield of the emulsion was 1,000 g.

(Sensitizing dye)

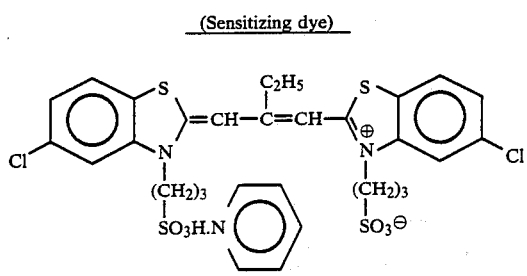

Preparation of light-sensitive composition (1)

A light-sensitive compositions (1) was prepared in the same manner as in Example 1 except that the following leuco dye was used in place of Pargascript Red I-6-B (tradename of Ciba-Geigy) and the silver halide emulsion (C) was used in place of the silver halide emulsion (A):

(Leuco dye)

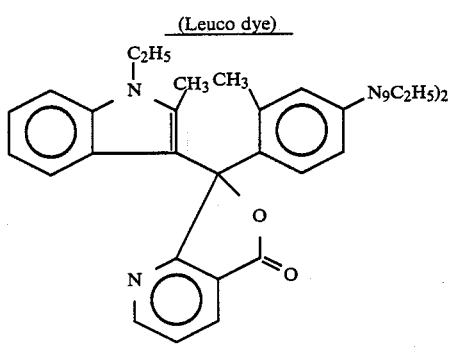

Preparation of light-sensitive microcapsule (1)

A light-sensitive microcapsule dispersion (1) was prepared in the same manner as in Example 1 except that the above-prepared light-sensitive composition (1) was used.

2. Preparation of green-sensitive microcapsule

Preparation of silver halide emulsion (D)

A silver halide emulsion (D) was prepared in the same manner as in the preparation of the silver halide emulsion (C) except that 47 ml of 1% methanol solution of the sensitizing dye used in the Example 1 was used in place of 90 ml of 0.5% methanol solution of the sensitizing dye.

Preparation of light-sensitive composition (2)

A light-sensitive compositions (2) was prepared in the same manner as in Example 1 except that the silver halide emulsion (D) was used in place of the silver halide emulsion (A).

Preparation of light-sensitive microcapsule (2)

A light-sensitive microcapsule dispersion (2) was prepared in the same manner as in Example 1 except that the above-prepared light-sensitive composition (2) was used.

3. Preparation of blue-sensitive microcapsule

Preparation of silver halide emulsion (E)

In 1,200 ml of water were dissolved 24 g of gelatin and 1.2 g of sodium chloride, and the resulting gelatin solution was kept at 65° C. To the gelatin solution, 600 ml of aqueous solution containing 87.6 g of potassium bromide and 2.2 g of potassium iodide and 600 ml of aqueous solution containing 0.74 mole of silver nitrate were added simultaneously at the same feed rate over 45 minutes. After 1 minute, to the mixture was added 50 ml of 1% methanol solution of the following sensitizing dye. The mixture was stirred for 15 minutes at 60° C. To the emulsion was added 1.2 g of isobutylene/monosodium maleate copolymer for sedimentation at 40° C. The emulsion was washed with water for desalting. Then, 24 g of gelatin was dissolved in the emulsion. Further, 2.5 mg of sodium thio sulfate was added to the emulsion for chemical sensitization at 60° C. for 40 minutes to obtain a silver halide emulsion (E). The yield of the emulsion was 1,000 g.

(Sensitizing dye)

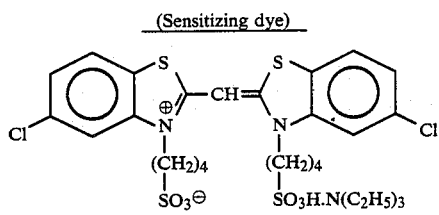

Preparation of light-sensitive composition (3)

A light-sensitive compositions (3) was prepared in the same manner as in Example 1 except that the following leuco dye was used in place of Pargascript Red I-6-B (tradename of Ciba-Geigy) and the silver halide emulsion (E) was used in place of the silver halide emulsion (A).

(Leuco dye)

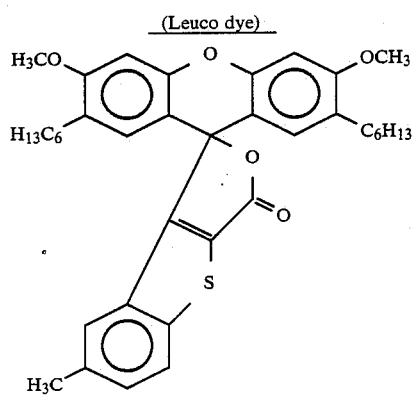

Preparation of light-sensitive microcapsule (3)

A light-sensitive microcapsule dispersion (3) was prepared in the same manner as in Example 1 except that the above-prepared light-sensitive composition (3) was used.

Preparation of light sensitive material (IV)

A light-sensitive material (IV) was prepared in the same manner as in Example 1 except that 10 g of the mixture of the above-prepared light-sensitive microcapsules dispersions (1), (2) and (3) (the amounts of the dispersions (1), (2) and (3) are the same) was used in place of the 10 g of the 10 g of the light-sensitive microcapsule dispersion, and 0.2 g of the silver halide emulsion (B) was added to the coating solution of the light-sensitive layer in place of the silver halide emulsion (A).

COMPARISON EXAMPLE 2

Preparation of light-sensitive material (V)

A light-sensitive material (V) was prepared in the same manner as in the Example 3 except that 0.2 g of the silver halide emulsion (B) was not added to the coating solution of the light-sensitive layer.

Evaluation of the light-sensitive material

Each of the light-sensitive materials prepared in Example 3 and Comparison Example 2 was imagewise exposed to light using a tungsten lamp at 2,000 lux for 1 second. Each of the light-sensitive materials was heated on a hot plate at 150° C., 155° C. or 160° C. for 10 seconds. Each of the light-sensitive materials was then combined with the image-receiving material prepared in Example 1 and they were pressed through a press roller at pressure of 450 kg/cm² to obtain an image on the image receiving material. The maximum density (Dmax) and the minimum density (Dmin) of the image were measured by using Macbeth reflection densitometer. The results are set forth in Table 4.

TABLE 4

| Light-sensitive Material | Heating Temperature | Maximum Density | Minimum Density |
|---|---|---|---|
| (IV) | 150° C. | 1.42 | 0.28 |
| (IV) | 155° C. | 1.30 | 0.08 |
| (IV) | 160° C. | 1.19 | 0.05 |
| (V) | 150° C. | 1.39 | 0.30 |
| (V) | 155° C. | 1.25 | 0.22 |
| (V) | 160° C. | 1.02 | 0.15 |

It is apparent from the results shown in Table 4 that the light-sensitive material (IV) of the present invention containing silver halide arranged outside of the microcapsules give a clear image having a high contrast, even if the material is heated at a relatively high temperature in the development process.

EXAMPLE 4

Preparation of silver halide emulsion (F)

In 1,200 ml of water were dissolved 24 g of gelatin and 1.2 g of sodium chloride, and the resulting gelatin solution was adjusted to pH 3.2 using 1 N sulfuric acid and kept at 60° C. To the gelatin solution, 600 ml of aqueous solution containing 117 g of potassium bromide and 600 ml of aqueous solution containing 0.74 mole of silver nitrate were added simultaneously at the same feed rate over 15 minutes. After 5 minutes, to the mixture, 200 ml of aqueous solution containing 4.3 g of potassium bromide was added over 5 minutes. To the emulsion was added 1.2 g of isobutylene/monosodium maleate copolymer for sedimentation. The emulsion was washed with water for desalting. Then, 24 g of gelatin was dissolved in the emulsion. Further, 5 mg of sodium thiosulfate and 0.47 g of the sensitizing dye (A) used in Example 1 were added to the emulsion for chemical sensitization at 60° C. for 15 minutes to obtain a silver halide emulsion (F). The yield of the emulsion was 1,000 g.

Preparation of light sensitive composition

In 100 g of the following polymerizable compound (KAYARAD R-604 produced by Nippon Kayaku Kogyo Co., Ltd.) were dissolved 1.6 g of the copolymer used in Example 1, 15 g of the following color image forming substance.

In the resulting solution were dissolved 7.0 g of the reducing agent (I) used in Example 1, 7.5 g of the following reducing agent (III), 2 g of the following surface active agent and 20 g of methylene chloride. The obtained solution was made uniform.

Separately, to 10 g of the silver halide emulsion (F) was added 2.5 g of the 10% aqueous solution of potassium bromide. The mixture was stirred for 5 minutes.

To the solution was added the above-obtained silver halide emulsion, and the mixture was stirred at 15,000 r.p.m. for 5 minutes at 25° C. using a homogenizer to obtain a light-sensitive composition in the form of a W/O emulsion.

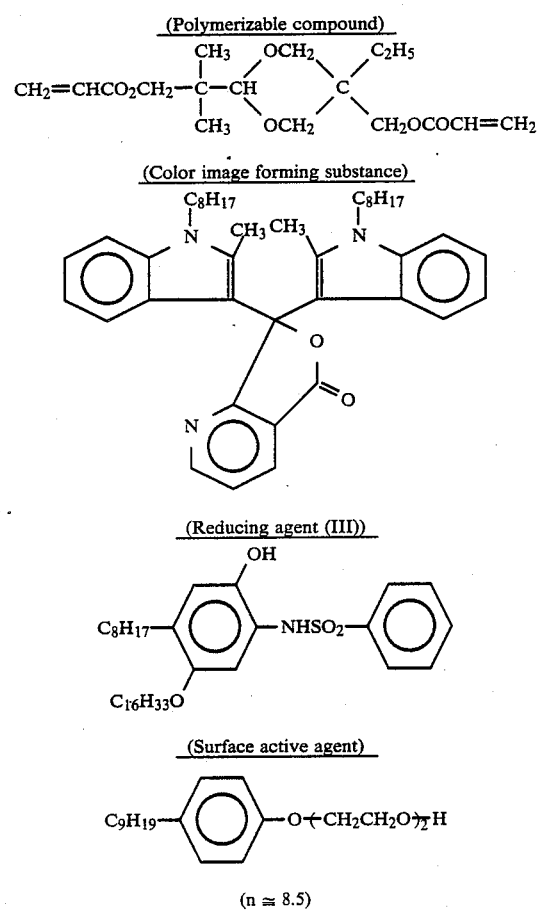

Preparation of light-sensitive microcapsule dispersion

To the light-sensitive composition was added 4.5 g of a polyisocyanate compound (Takenate D110N of Takeda Chemical Industries, Ltd.). The mixture was stirred for 5 minutes. The resulting mixture was added to 210 g of 10% aqueous solution of partial sodium salt of polyvinylbenzene sulfonic acid (trade name: VERSA TL-502, available from National Starch, Co.). The mixture was stirred at 9,000 r.p.m. for 30 minutes at 40° C. using a homogenizer to obtain a W/O/W emulsion.

Independently, 34.5 g of melamine and 57 g of 37% aqueous solution of formaldehyde were added to 186 g of water, and the resulting mixture was stirred at 60° C. for 30 minutes to obtain a transparent melamine-formaldehyde precondensate.

To the above-prepared W/O/W emulsion was added 80 g of the precondensate while stirring, and the resulting mixture was adjusted to pH 6.0 using 20% aqueous solution of phosphoric acid. The mixture was then heated to 60° C. and stirred for 90 minutes.

To the mixture was added 30 g of 40% aqueous solution of urea, and the resulting mixture was adjusted to pH 3.5 using 20% aqueous solution of phosphoric acid. The mixture was then heated to 60° C. and stirred for 40 minutes. The mixture was cooled to room temperature, and adjusted to pH 7.0 using 10% aqueous solution of sodium hydroxide to obtain a light-sensitive microcapsule dispersion containing microcapsules having melamine formaldehyde resin shell.

Washing of microcapsule dispersion

The microcapsules were precipitated from the dispersion in a centrifuge at 1,000 r.p.m. for 30 minutes. The supernatant was removed from the dispersion, and the same amount of distilled water was added to the dispersion.

The above-mentioned process was further repeated twice. The obtained washed microcapsule dispersion was adjusted to the same solid content as that of the unwashed microcapsule dispersion.

Preparation of dispersion of base precursor (A)

To 160 g of 3% aqueous solution of cationated polyvinyl alcohol (PVA-C318-2-A produced by Kraray Co., Ltd.) was added 40 g of the base precursor used in Example 1. The mixture was stirred at 3,000 r.p.m. for 2 hours in Dynomill dispersing device to obtain 20% dispersion of the base precursor (A).

Preparation of light-sensitive material (VI)

To 40 g of the washed microcapsule dispersion was added 8 g of the dispersion of the base precursor (A). The mixture was stirred for 20 minutes. To the mixture was 2 g of the silver halide emulsion (F). The mixture was stirred for 10 minutes.

To the mixture were further added 10 g of 20% aqueous solution of sorbitol and 6 g of 5% aqueous solution of Emulex NP-8 (tradename of Nippon Emulsion Co., Ltd.). Distilled water was added to the mixture to prepare 75 g of a coating solution for a light-sensitive layer.

The coating solution was coated over a polyethylene terephthalate film in coating amount of 45 g/m² to form a light-sensitive layer. The coated layer was dried at about 40° C. to prepare a light-sensitive material (VI).

The light-sensitive material (VI) was observed using a scanning electron microscope. As a result, all of the silver halide grains arranged outside of the microcapsules (the amount of the silver halide arranged outside was the same as the amount of the silver halide contained in the microcapsules) were substantially adsorbed on the surface of the microcapsules.

Further, at least 70% of the number of the solid particles of the base precursor were adsorbed on the surface of the microcapsules.

EXAMPLE 5

Preparation of silver halide emulsion (G)

In 1,200 ml of water were dissolved 24 g of gelatin and 1.2 g of sodium chloride, and the resulting gelatin solution was adjusted to pH 3.2 using 1 N sulfuric acid and kept at 60° C. To the gelatin solution, 600 ml of aqueous solution containing 117 g of potassium bromide and 600 ml of aqueous solution containing 0.74 mole of silver nitrate were added simultaneously at the same feed rate over 15 minutes. After 5 minutes, to the mixture, 200 ml of aqueous solution containing 4.3 g of potassium iodide was added over 5 minutes. To the emulsion was added 1.2 g of isobutylene/monosodium maleate copolymer for sedimentation. The emulsion was washed with water for desalting. Then, 24 g of gelatin was dissolved in the emulsion. Further, 5 ml of 0.05% aqueous solution of thiourea dioxide (fogging agent) and 1 ml of 0.1% aqueous solution of chloroauric acid were added to the emulsion for ripening at 60° C. for 30 minutes to obtain a fogged silver halide emulsion (G). The yield of the emulsion was 1,000 g.

Preparation of dispersion of base precursor (B)

A dispersion of the base precursor (B) was prepared in the same manner as in the preparation of the dispersion of the base precursor (B) except that 160 g of 2% aqueous solution of gelatin was used in place of the 160 g of 3% aqueous solution of cationated polyvinyl alcohol.

Preparation of light-sensitive material (VII)

A light-sensitive material (VII) was prepared in the same manner as in the Example 4 except that 2 g of the above-prepared silver halide emulsion (G) was used in place of 2 g of the silver halide emulsion (F) which was added to the coating solution of the light-sensitive layer, and 8 g of the dispersion of the base precursor (B) was used in place of 8 g of the dispersion of the base precursor (A).

The light-sensitive material (VII) was observed using a scanning electron microscope. As a result, all of the silver halide grains arranged outside of the microcapsules (the amount of the silver halide arranged outside was the same as the amount of the silver halide contained in the microcapsules) were substantially adsorbed on the surface of the microcapsules.

Further, at least 70% of the number of the solid particles of the base precursor were adsorbed on the surface of the microcapsules.

COMPARISON EXAMPLE 3

Preparation of light-sensitive material (VIII)

A light-sensitive material (VIII) was prepared in the same manner as in the Example 4 except that the silver halide emulsion is not added to the coating solution of the light-sensitive layer.

COMPARISON EXAMPLE 4

Preparation of light-sensitive material (IX)

A light-sensitive material (IX) was prepared in the same manner as in the Example 5 except that the silver halide emulsion is not added to the coating solution of the light-sensitive layer.

Preparation of image receiving material

In 123 g of water was dissolved 2.5 g of sodium hexametaphosphate, and to the solution were further added 22 g of zinc 3,5-di-α-methylbenzylsalicylate and 53 g of 55% slurry of calcium carbonate, followed by finely dispersing in Dynomill dispersing device. To 40 g of the resulting dispersion were added 10 g of 8% aqueous solution of polyvinyl alcohol, 4 g of 10% aqueous solution of gelatin and 1.6 g of zinc chloride, and the resulting mixture was made uniform to give a coating solution for an image-receiving layer. The coating solution was uniformly coated on an art paper having basis weight of 70 g/m$^2$ to give a coating layer having wet thickness of 90 μm. The coated layer was dried to prepare an image receiving material.

Evaluation of the light sensitive material

Each of the light-sensitive materials prepared in Examples 4 & 5 and Comparison Examples 3 & 4 imagewise exposed to light using a tungsten lamp through an optical wedge. Each of the light-sensitive materials was heated on a hot plate at 150° C. for 15 seconds. Each of the light-sensitive materials was then combined with the image-receiving material and they were pressed through a press roller at pressure of 550 kg/cm$^2$ to obtain an image on the image receiving material. The maximum density (Dmax) and the minimum density (Dmin) of the image were measured by using Macbeth reflection densitometer. The results are set forth in Table 5.

In Table 5, "Silver Halide" indicates the kind of the silver halide contained in the microcapsules (Inside) and the kind of the silver halide arranged outside of the microcapsules (Outside).

TABLE 5

| Light-sensitive Material | Silver Halide | | Base Precursor | Dmax | Dmin |
| --- | --- | --- | --- | --- | --- |
| | Inside | Outside | | | |
| (VI) | (A) | (A) | (A) | 1.29 | 0.06 |
| (VII) | (A) | (B) | (B) | 1.30 | 0.06 |
| (VIII) | (A) | — | (A) | 1.15 | 0.14 |
| (IX) | (A) | — | (B) | 1.12 | 0.16 |

It is apparent from the results shown in Table 5 that the light-sensitive materials of the present invention containing silver halide arranged outside of the microcapsules give a clear image having a high contrast.

I claim:

1. A light-sensitive material comprising a support and a light-sensitive layer which contains silver halide, a reducing agent and an ethylenic unsaturated polymerizable compound, said silver halide and polymerizable compound being contained in microcapsules which are dispersed in the light-sensitive layer, wherein the light-sensitive layer further contains silver halide outside of the microcapsules.

2. The light-sensitive material as claimed in claim 1, wherein the sensitivity of the silver halide outside of the microcapsules is higher than the sensitivity of the silver halide contained in the microcapsules, and the difference between the two silver halides in sensitivity is not less than 0.3 in terms of log E.

3. The light-sensitive material as claimed in claim 1, wherein the sensitivity of the silver halide outside of the microcapsules is higher than the sensitivity of the silver halide in the microcapsules, and the difference between the two silver halides in sensitivity is not less than 0.5 in terms of log E.

4. The light-sensitive material as claimed in claim 1, wherein the silver halide outside of the microcapsules is fogged silver halide.

5. The light-sensitive material as claimed in claim 1, wherein the reducing agent is present in the microcapsules.

6. The light-sensitive material as claimed in claim 1, wherein at least 70 weight % of the silver halide contained in the microcapsules is present in the shell of the microcapsules.

7. The light-sensitive material as claimed in claim 1, wherein the amount of the silver halide outside of the microcapsules is in the range of 5 to 100 mole % of the amount of the silver halide in the microcapsules.

8. The light-sensitive material as claimed in claim 1, wherein the total amount of silver in the silver halide present in the light-sensitive layer is in the range of 0.1 mg/m$^2$ to 10 g/m$^2$.

9. The light-sensitive material as claimed in claim 1, wherein the silver halide outside of the microcapsules is adsorbed on the surface of the microcapsules.

10. The light-sensitive material as claimed in claim 1, wherein the light-sensitive layer further contains a base or base precursor in the form of solid particles which are adsorbed on the surface of the microcapsules.

11. The light-sensitive material as claimed in claim 1, wherein the microcapsules have an average particle size in the range of 1 to 30 μm.

12. The light-sensitive material as claimed in claim 1, wherein the silver halide outside of the micro capsules is in the form of silver halide grains having an average grain size in the range of 0.001 to 10 μm.

13. The light-sensitive material as claimed in claim 1, wherein the light-sensitive layer further contains a cationic polymer which is adsorbed on the surface of the microcapsules.

* * * * *